(12) United States Patent
Weng et al.

(10) Patent No.: US 7,061,079 B2
(45) Date of Patent: Jun. 13, 2006

(54) CHIP PACKAGE STRUCTURE AND MANUFACTURING METHOD THEREOF

(75) Inventors: Gwo-Liang Weng, Kaohsiung (TW); Shih-Chang Lee, Kaohsiung (TW); Cheng-Yin Lee, Tainan (TW)

(73) Assignee: Advanced Semiconductor Engineering, Inc., Kaohsiung (TW)

( * ) Notice: Subject to any disclaimer, the term of this patent is extended or adjusted under 35 U.S.C. 154(b) by 0 days.

(21) Appl. No.: 10/904,574

(22) Filed: Nov. 17, 2004

(65) Prior Publication Data

US 2005/0104194 A1     May 19, 2005

(30) Foreign Application Priority Data

Nov. 17, 2003   (TW) ............................. 92132104 A

(51) Int. Cl.
*H01L 23/495*     (2006.01)
(52) U.S. Cl. ................. 257/675; 257/720; 257/717; 438/122
(58) Field of Classification Search ............... 438/122; 257/675, 720, 717, 676
See application file for complete search history.

(56) References Cited

U.S. PATENT DOCUMENTS 6,784,023 B1 *   8/2004   Ball ........................... 438/113
6,969,640 B1 *  11/2005   Dimaano, Jr. et al. ...... 438/122

* cited by examiner

*Primary Examiner*—Matthew S. Smith
*Assistant Examiner*—Su C. Kim
(74) *Attorney, Agent, or Firm*—Jianq Chyun IP Office

(57) ABSTRACT

The present invention provides a chip package structure and the manufacturing method thereof, which affords higher heat dissipation efficiency and is suitable to fabricate the stack type package structure with a higher integration. The chip package structure comprises a carrier, at least a chip, a heat sink and a mold compound. The chip is disposed on the carrier, while the bonding pads of the chip are electrically connected to the leads of the carrier. The heat sink is disposed over the chip and includes at least a body and a plurality of connecting portions. The connecting portions are disposed around a periphery of the body and are electrically connected to the leads. By using a specially designed heat sink, the chip package structure can afford better heat dissipation and be suitable to form stack type package structures.

19 Claims, 5 Drawing Sheets

CHIP PACKAGE STRUCTURE AND MANUFACTURING METHOD THEREOF

CROSS-REFERENCE TO RELATED APPLICATION

This application claims the priority benefit of Taiwan application Ser. no. 92132104, filed on Nov. 17, 2003.

BACKGROUND OF THE INVENTION

1. Field of Invention

The present invention relates to a package structure and the manufacturing method thereof. More particularly, the present invention relates to a stacked chip package structure and the manufacturing method thereof.

2. Description of Related Art

Following the quick progress in the fabrication of integrated circuits, the design of the electrical products becomes more complex and high-speed and multi-function chips are developed. As the integration of ICs keeps increasing and the layout of the high-speed semiconductor devices becomes dense, more heat is generated by the semiconductor device per unit area in a certain period. Thus, it is important for the design of semiconductor devices to consider the heat dissipation issue, in order to prevent damages to the electronic devices or the chips.

Conventionally, a metal heat dissipation plate, for dissipating heat resulting from the operation of the chip, is disposed on the outer surface of the mold compound, so that the heat dissipation plate can help dissipate heat generated from the operation of the chip into the external environment outside the mold compound.

FIG. 1 is a cross-sectional view of a prior quad flat no-lead (QFN) package structure. Referring to FIG. 1, the QFN package structure 100 includes a leadframe 110, a chip (or die) 120, a plurality of wires 130, a heat sink 140 and a mold compound 150. The leadframe 110 includes a die pad 112 and a plurality of leads 114. The chip 120 has an active surface 120a with a plurality of bonding pads 122 disposed on the active surface 120a, while the chip 120 is fixed to the die pad 112. Each bonding pad 122 is electrically connected to one of the leads 114 through the wire 160 by wire bonding.

As shown in FIG. 1, the heat sink 140 is disposed on the mold compound 150. The shape of the heat sink can be varied depending on the requirements of heat dissipation and layout design. The mold compound 150 is filled within the space between the heat sink 140 and the leadframe 110, covering the leads 114, the bonding pads 122 and the wires 130. As the chip 120 is in operation, the produced heat can be dissipated by the heat sink 140 through the mold compound 150.

For electronic modules (such as DRAMs) with multiple chip packages, the chip packages are usually stacked up and connected in parallel to provide better electrical properties and faster transmission speed. Hence, the size and the area of the package structure are reduced. Although the heat sink may assist heat dissipation, multiple wires are needed to connect the chip package structures for the stack type package structure. Therefore, the costs, the complexity and the uncertainty of the fabrication processes are increased.

SUMMARY OF THE INVENTION

The present invention provides a chip package structure and the manufacturing method thereof, which affords higher heat dissipation efficiency and is suitable to fabricate the stack type package structure with a higher integration.

Accordingly, the present invention provides a chip package structure, comprising a carrier, at least a chip, a heat sink and a mold compound. The chip is disposed on the carrier, while the bonding pads of the chip are electrically connected to the leads of the carrier. The heat sink is disposed over the chip and includes at least a body and a plurality of connecting portions. The connecting portions are disposed around a periphery of the body and are electrically connected to the leads.

The aforementioned package structure can employ wiring bonding technology or flip chip technology to connect the chip to the carrier. The heat sink can be integrally formed as one piece or separately formed.

As embodied and broadly described herein, the present invention provides a manufacturing method for the chip package structure, the method comprising the following steps: providing a carrier having a plurality of leads; disposing a chip on the carrier, so that the chip is electrically connected to the carrier; providing a heat sink including a body, a plurality connecting portions and a plurality of protrusions, while each connecting portion is connected to the body through a protrusion; disposing the heat sink above the chip and connecting the connecting portions to the leads; filling a mold compound into a space enclosed by the heat sink and the carrier; and removing the protrusions of the heat sink, so that the connecting portions are separated from the body.

Because the heat sink is disposed over the chip and a mold compound is formed between the chip and the heat sink, heat generated by the chip can be dissipated by the heat sink via the mold compound. In this invention, the connecting portions of the heat sink are disposed around a periphery of the body and connected to the leads. By using a specially designed heat sink, the chip package structure can afford better heat dissipation and be suitable to form stack type package structures.

It is to be understood that both the foregoing general description and the following detailed description are exemplary, and are intended to provide further explanation of the invention as claimed.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention.

DESCRIPTION OF THE PREFERRED EMBODIMENTS

Figure 1:
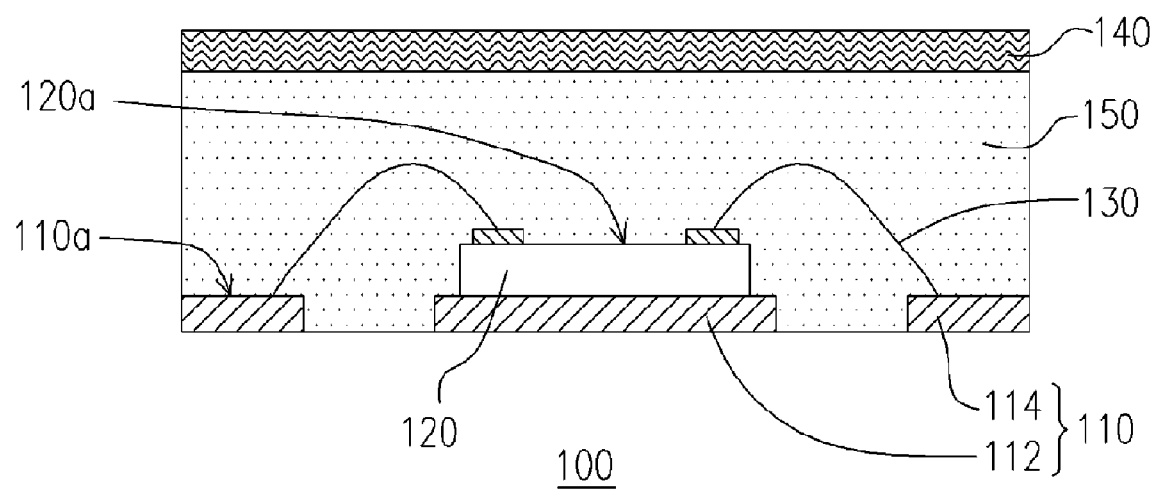
FIG. 1 is a cross-sectional view of a prior QFN package structure.
Figure 2A:
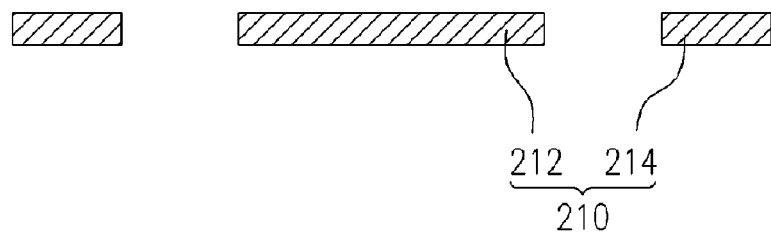
FIGS. 2A–2F are display cross-sectional views showing the manufacturing process steps of a QFN package structure according to the first preferred embodiment of the present invention.
Figure 2B:
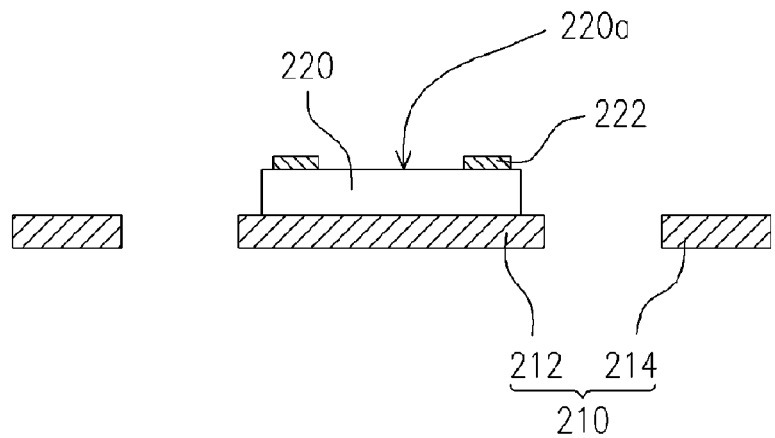
Figure 2C:
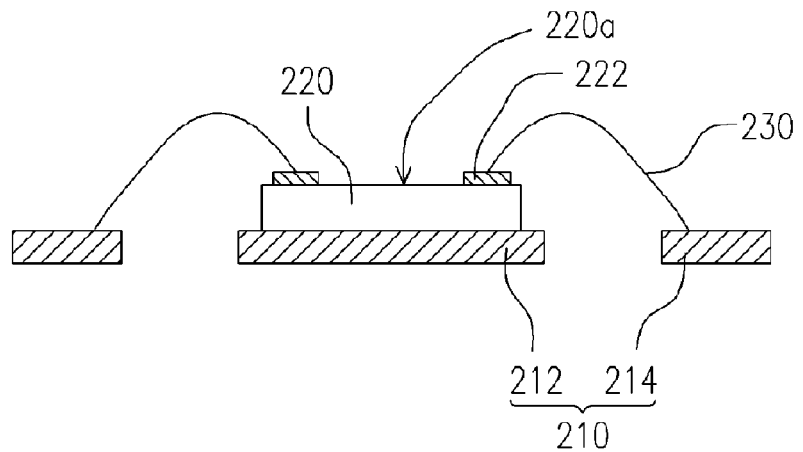

FIGS. 2A–2F are display cross-sectional views showing the manufacturing process steps of a QFN package structure according to the first preferred embodiment of the present invention. Referring to FIG. 2A, a leadframe 210 used as a carrier is provided. The leadframe 210 includes a die pad 212 and a plurality of leads 214. As shown in FIG. 2B, a chip 220 is disposed on the die pad 212. The chip 220 has an active surface 220a and a plurality of bonding pads 222 on the active surface 220a. Referring to FIG. 2C, each of the leads 214 is connected to one bonding pad 222 through a plurality of wires 230 by, for example, wire bonding.

Figure 2D:
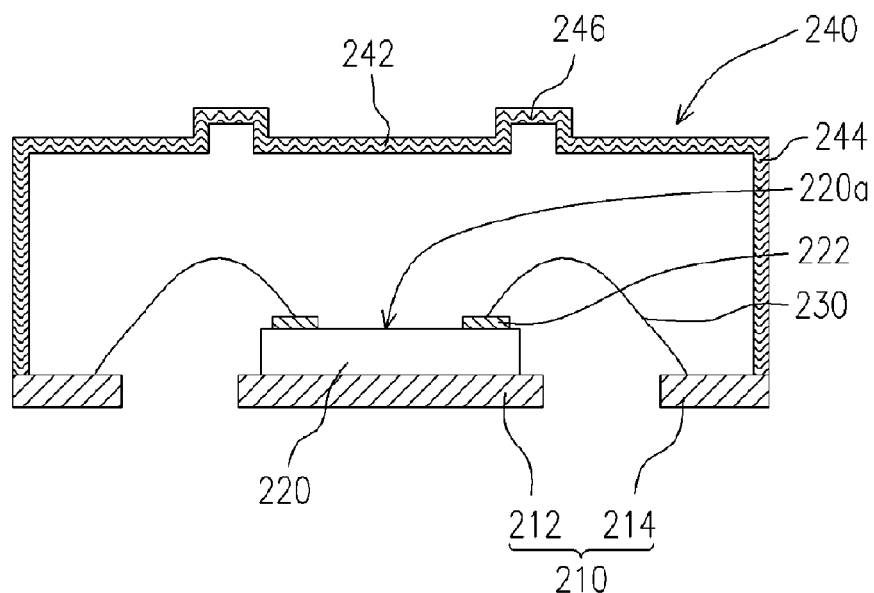
Figure 2E:
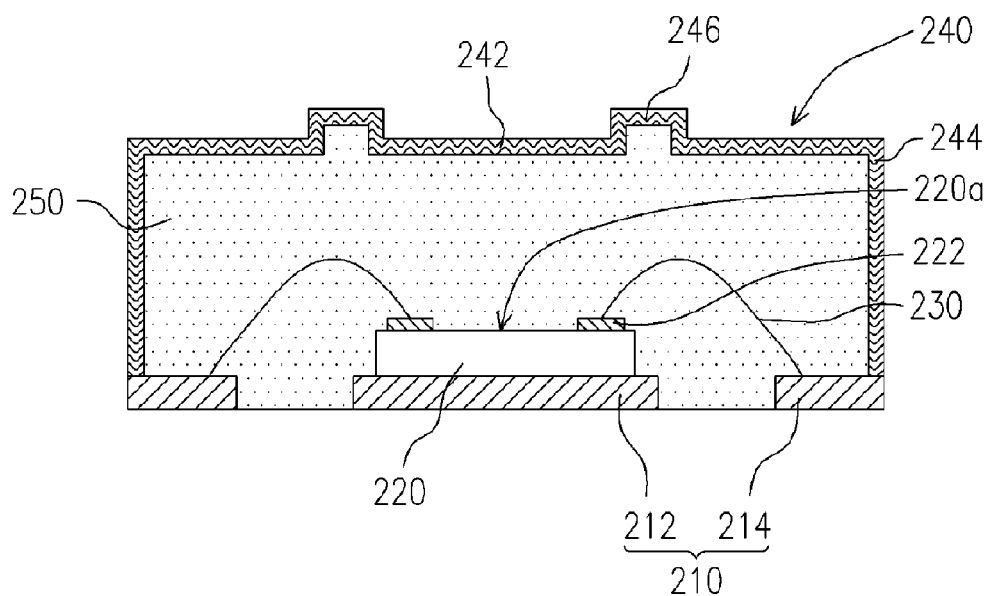
Figure 2F:
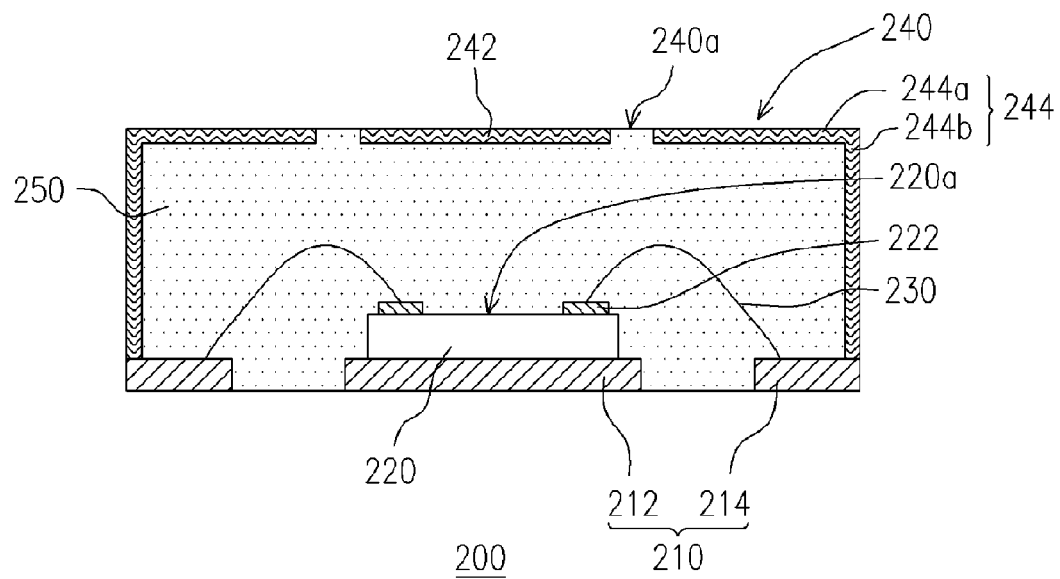

Referring to FIG. 2D, a heat sink (or heat dissipation plate) 240 is provided. The heat sink 240 is made of a conductive material and has a body 242, a plurality of connecting portions 244 and a plurality of protrusions 246. The heat sink may be in a spider shape from the top view, for example. The connecting portions 244 are disposed around the edge of the body 242 and are connected to the body 242 and the protrusions 246. As the heat sink 240 is disposed above the chip 220, the connecting portions 244 are electrically connected to the leads 214 through a conductive glue layer (not shown), for example. As shown in FIG. 2E, a mold compound 250 is filled into the space between the leadframe 210 and the heat sink 240. The mold compound 250 covers the chip 220. Later, as shown in FIG. 2F, a polishing process is performed to remove the protrusions 246 of the heat sink 240, so that a plurality of openings 240a is formed in the upper flat portion of the heat sink 240. By forming the openings 240a, the connecting portions 244 are separated from the body 242, while each connecting portion 244 is separated from one another. Each connecting portion 244 includes an upper flat portion 244a and a lower supporting portion 244b. Hence, the QFN chip package structure 200 is obtained. It is noted that the mold compound 250 in the above structure is disposed within and inside of the heat sink 240. However, the mold compound may be disposed outside of the connecting portions 244 and covers the connecting portions 244 for protecting the connecting portions 244.

For the above QFN package structure, the heat sink 240 above the chip 220 helps dissipate heat. Through the mold compound, the heat produced from the operation of the chip can be transferred to the heat sink and then be dissipated to the outside environment by the heat sink. In the design of the heat sink, after removing the protrusions to form the openings, the connecting portions 244 are separated from the body 242 but still are electrically connected to the leads 214. Hence, the upper flat portions 244a of the connecting portions 244 can be considered as contact pads electrically connected to the leads. When applied to form a stack type chip package structure, the upper flat portions 244a (as contact pads) of the connecting portions 244 can be directly connected to the leads of another chip package structure, without using extra wires.

Figure 3:
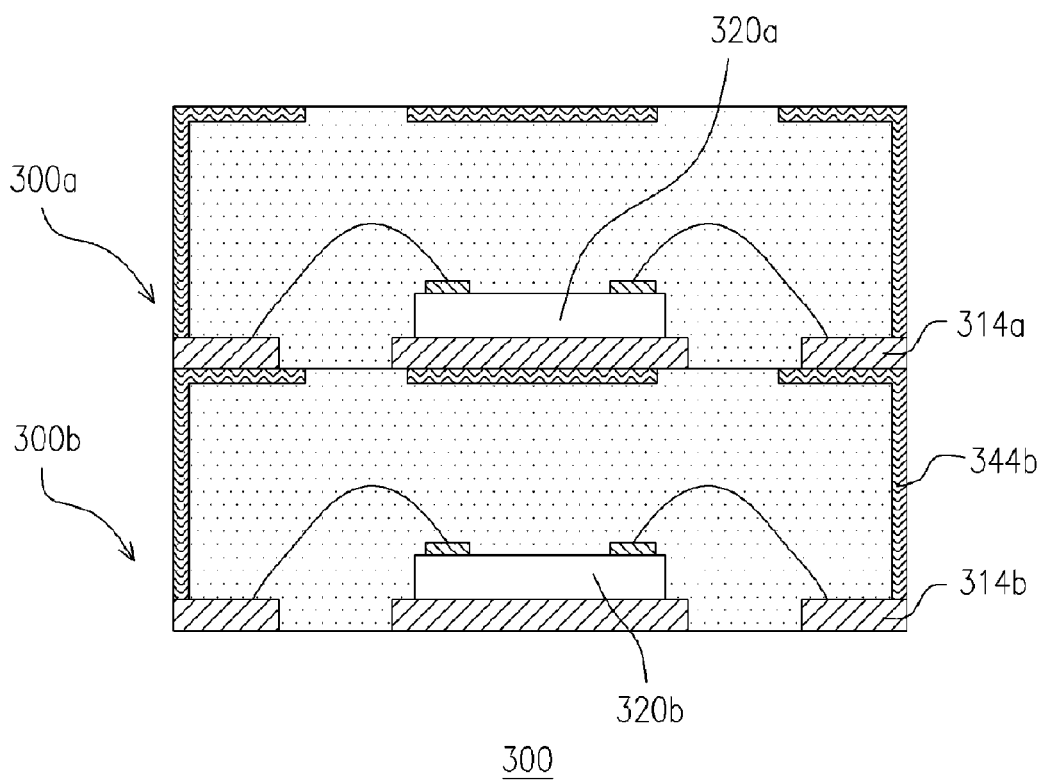
FIG. 3 is a display cross-sectional view showing a stack type chip package structure according to one preferred embodiment of the present invention.

According to this invention, the QFN chip package structure can be used to form a stack type chip package structure. As shown in FIG. 3, the stack type chip package structure 300 includes a first chip package structure 300a and a second chip package structure 300b. The structures and elements of the first and second chip package structures 300a/300b are similar or identical to the QFN chip package structure described above, and will not be illustrated in details. The first leads 314a of the first chip package structure 300a are electrically connected to the second leads 314b of the second chip package structure 300b via the second connecting portions 344b of the second chip package structure 300b. The first leads 314a can be connected with the second connecting portions 344b through a conductive solder material or a conductive adhesive, for example. Therefore, the first chip 320a is electrically connected to the second chip 320b. However, the stack type chip package structure is not limited to the double-stacked structure described above, and can be in multiple layered or in other forms.

Figure 4:
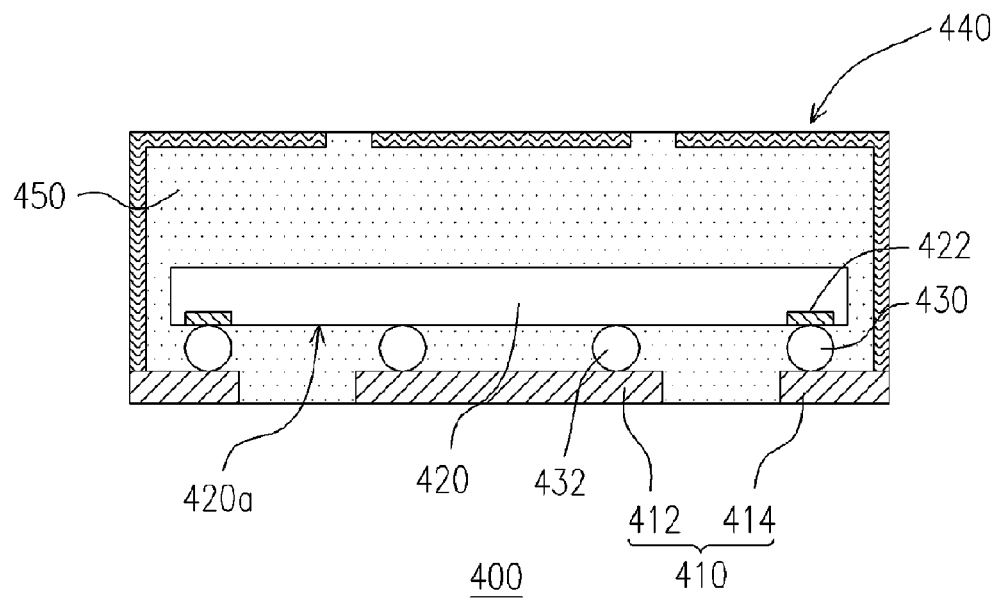
FIG. 4 is a cross-sectional view showing a QFN package structure according to the second preferred embodiment of the present invention.

For the above QFN package structure, except for wire bonding, flip chip technology may be applied to connect the chip and the leadframe. FIG. 4 is a cross-sectional view showing a QFN package structure according to the second preferred embodiment of the present invention. In the QFN chip package structure 400, the chip 420 is electrically connected to the leadframe 410 by flip chip technology. Conductive bumps 430 electrically and physically connects the leads 414 of the leadframe 410 and the bonding pads 422 of the chip 420. The mold compound 450 is disposed between the leadframe 410 and the heat sink 440, and covers the chip 420. Moreover, a plurality of thermal conductive blocks 432 are disposed between the active surface 420a of the chip 420 and the die pad 412 of the leadframe 410. The thermal conductive blocks 432 can be formed with the conductive bumps in the same process, for example. The conductive bumps 430 are disposed between the leads 414 of the leadframe 410 and the bonding pads 422 of the chip 420 for electrically connecting the leadframe 410 and the chip 420. On the other hand, the thermal conductive blocks 432 are disposed between the active surface 420a of the chip 420 and the die pad 412 of the leadframe 410 for heat dissipation purposes. With this arrangement, the thermal conductive blocks 432 help transfer heat from the active surface 420a of the chip to the die pad 412, and heat can then be dissipated to the outside environment by the die pad 412.

Figure 5:
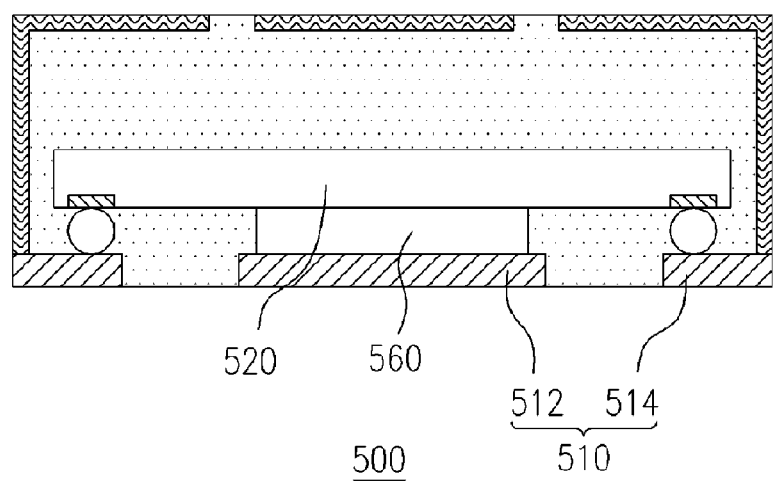
FIG. 5 is a cross-sectional view showing a QFN package structure according to the third preferred embodiment of the present invention.

FIG. 5 is a cross-sectional view showing a QFN package structure according to the third preferred embodiment of the present invention. In the QFN chip package structure 500, the chip 520 is electrically connected to the carrier (the leadframe) 510 by flip chip technology. Instead of forming the thermal conductive blocks, a thermal conductive layer 560 is formed between the chip 520 and the die pad 512. Since the contact area of the thermal conductive layer is even broader than the total contact areas of the thermal conductive blocks, better heat dissipation can thus be provided.

Accordingly, the present invention provides QFN chip package structures and the manufacturing method thereof. By using a specially designed heat sink, the QFN package structure can afford better heat dissipation and be suitable to form stack type package structures. Although the leadframe is used as the carrier in the above embodiments, other carriers can be employed.

In conclusion, the present invention provides a quad flat no-lead (QFN) package structure and a fabrication process thereof, with improved electrical properties and faster transmission speed. Moreover, this QFN package structure is suitable to form stack type package structures, so that the size and the area of the package structure can be minimized.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims and their equivalents.

What is claimed is:

1. A chip package structure, comprising:
   a carrier having a carrying surface, wherein the carrier comprises a plurality of conductive leads;
   a chip, disposed on the carrying surface of the carrier and having an active surface, wherein a plurality of bonding pads is disposed on the active surface and is electrically connected to the conductive leads;
   a heat sink, disposed above the chip, wherein the heat sink includes a body and a plurality of connecting portions and the connecting portions are disposed around a periphery of the body but are not connected to the body, and wherein lower portions of the connecting portions that are farther away from the body are electrically connected to the conductive leads; and
   a mold compound covering the chip and filling up a space enclosed by the carrier and the heat sink.

2. The package structure as claimed in claim 1, further comprising a plurality of wires, wherein each of the wire electrically connects one of the bonding pads and one of the conductive leads.

3. The package structure as claimed in claim 1, wherein the carrier includes a leadframe.

4. The package structure as claimed in claim 1, wherein the heat sink is integrally formed.

5. The package structure as claimed in claim 1, further comprising a conductive glue layer, wherein the connecting portions and the conductive leads are electrically connected through the conductive glue layer.

6. The package structure as claimed in claim 1, further comprising a plurality of bumps, wherein each of the bumps electrically connects one of the bonding pads and one of the conductive leads.

7. The package structure as claimed in claim 1, further comprising a thermal conductive layer, wherein the thermal conductive layer is disposed between a die pad of the carrier and the chip.

8. The package structure as claimed in claim 1, further comprising a plurality of thermal conductive blocks, wherein the thermal conductive blocks are disposed between a die pad of the carrier and the chip.

9. A stack type chip package structure, comprising:
   a first chip package structure comprising a first carrier having a plurality of first leads, a first chip disposed on the first carrier and having a plurality of first bonding pads electrically connected to the first leads, a first heat sink disposed above the first chip and having a first body and a plurality of first connecting portions, and a first mold compound covering the first chip and filled between the first carrier and the first heat sink,
   wherein the first connecting portions of the first heat sink are disposed around a periphery of the first body but are not connected to the first body, and the first connecting portions are electrically connected to the first leads; and
   a second chip package structure comprising a second carrier having a plurality of second leads, a second chip disposed on the second carrier and having a plurality of second bonding pads electrically connected to the second leads, a second heat sink disposed above the second chip and having a second body and a plurality of second connecting portions, and a second mold compound covering the second chip and filled between the second carrier and the second heat sink,
   wherein the second connecting portions of the second heat sink are disposed around a periphery of the second body but are not connected to the second body, and the second connecting portions are electrically connected to the second leads, and
   wherein the first leads of the first chip package structure are electrically connected to the second leads of the second chip package structure via the second connecting portions of the second heat sink of the second chip package structure, so that the first chip is electrically connected to the second chip.

10. The package structure as claimed in claim 9, wherein the first chip package structure further comprises a plurality of wires, wherein each of the wire electrically connects one of the first bonding pads and one of the first leads.

11. The package structure as claimed in claim 9, wherein the second chip package structure further comprises a plurality of wires, wherein each of the wire electrically connects one of the second bonding pads and one of the second leads.

12. The package structure as claimed in claim 9, wherein the first carrier includes a leadframe.

13. The package structure as claimed in claim 9, wherein the second carrier includes a leadframe.

14. The package structure as claimed in claim 9, wherein the first chip package structure further comprises a plurality of bumps, wherein each of the bumps electrically connects one of the first bonding pads and one of the first leads.

15. The package structure as claimed in claim 9, wherein the second chip package structure further comprises a plurality of bumps, wherein each of the bumps electrically connects one of the second bonding pads and one of the second leads.

16. The package structure as claimed in claim 9, wherein the first chip package structure further comprises a thermal conductive layer, wherein the thermal conductive layer is disposed between a die pad of the first carrier and the first chip.

17. The package structure as claimed in claim 9, wherein the second chip package structure further comprises a thermal conductive layer, wherein the thermal conductive layer is disposed between a die pad of the second carrier and the second chip.

18. The package structure as claimed in claim 9, wherein the first chip package structure further comprises a plurality of thermal conductive blocks, wherein the thermal conductive blocks are disposed between a die pad of the first carrier and the first chip.

19. The package structure as claimed in claim 9, wherein the second chip package structure further comprises a plurality of thermal conductive blocks, wherein the thermal conductive blocks are disposed between a die pad of the second carrier and the second chip.

* * * * *